United States Patent
Zhou et al.

(10) Patent No.: US 10,497,591 B2
(45) Date of Patent: Dec. 3, 2019

(54) LOAD LOCK CHAMBER AND THE CLUSTER TOOL SYSTEM USING THE SAME

(71) Applicant: PIOTECH CO., LTD., Shenyang (CN)

(72) Inventors: Ren Zhou, Shenyang (CN); Xuyen Pham, Shenyang (CN); Brian Lu, Shenyang (CN); Sean Chang, Shenyang (CN); Shicai Fang, Shenyang (CN); Jie Lian, Shenyang (CN); Enguo Men, Shenyang (CN)

(73) Assignee: PIOTECH CO., LTD., Shenyang (CN)

( * ) Notice: Subject to any disclaimer, the term of this patent is extended or adjusted under 35 U.S.C. 154(b) by 295 days.

(21) Appl. No.: 15/267,698

(22) Filed: Sep. 16, 2016

(65) Prior Publication Data

US 2017/0271187 A1    Sep. 21, 2017

(30) Foreign Application Priority Data

Mar. 16, 2016  (CN) .......................... 2016 1 0153803

(51) Int. Cl.
  *H01L 21/67* (2006.01)

(52) U.S. Cl.
  CPC .............................. *H01L 21/67201* (2013.01)

(58) Field of Classification Search
  CPC ....................... B25J 15/0095; H01L 21/67155
  See application file for complete search history.

(56) References Cited

U.S. PATENT DOCUMENTS

| | | | | |
|---|---|---|---|---|
| 6,486,444 B1* | 11/2002 | Fairbairn | .......... | H01L 21/67196 118/50.1 |
| 6,729,834 B1* | 5/2004 | McKinley | .......... | H01L 21/6835 414/222.01 |
| 7,207,766 B2* | 4/2007 | Kurita | .................. | B65G 49/064 414/641 |
| 7,654,596 B2* | 2/2010 | Mantz | ............... | H01L 21/68707 294/103.1 |
| 7,695,232 B2* | 4/2010 | Moore | .............. | H01L 21/67201 414/217 |
| 8,033,769 B2* | 10/2011 | Gage | ................. | H01L 21/67196 414/217 |
| 2003/0213560 A1* | 11/2003 | Wang | .................... | C23C 14/566 156/345.31 |
| 2004/0137741 A1* | 7/2004 | Chebi | ................... | B08B 7/0071 438/694 |
| 2006/0113806 A1* | 6/2006 | Tsuji | ................. | H01L 21/68707 294/213 |

* cited by examiner

*Primary Examiner* — Mark C Hageman
(74) *Attorney, Agent, or Firm* — Locke Lord LLP; Tim Tingkang Xia, Esq.

(57) ABSTRACT

Disclosed is a load lock chamber which includes a chamber body including: at least one pair of cavities, defined in a layer structure of the chamber body to carry one or more wafer substrates; at least one internal conduit, defined between and coupled with the paired cavities, such that the paired cavities are communicated with each other and capable of conducting gas refilling and exhaustion; and a plurality of wafer supports for carrying the wafer substrates, the plurality of wafer supports being securely received in the paired cavities and able to calibrate with a machine arm frontend finger, wherein the wafer support includes grooves defined thereon for calibrating the machine arm frontend finger.

9 Claims, 8 Drawing Sheets

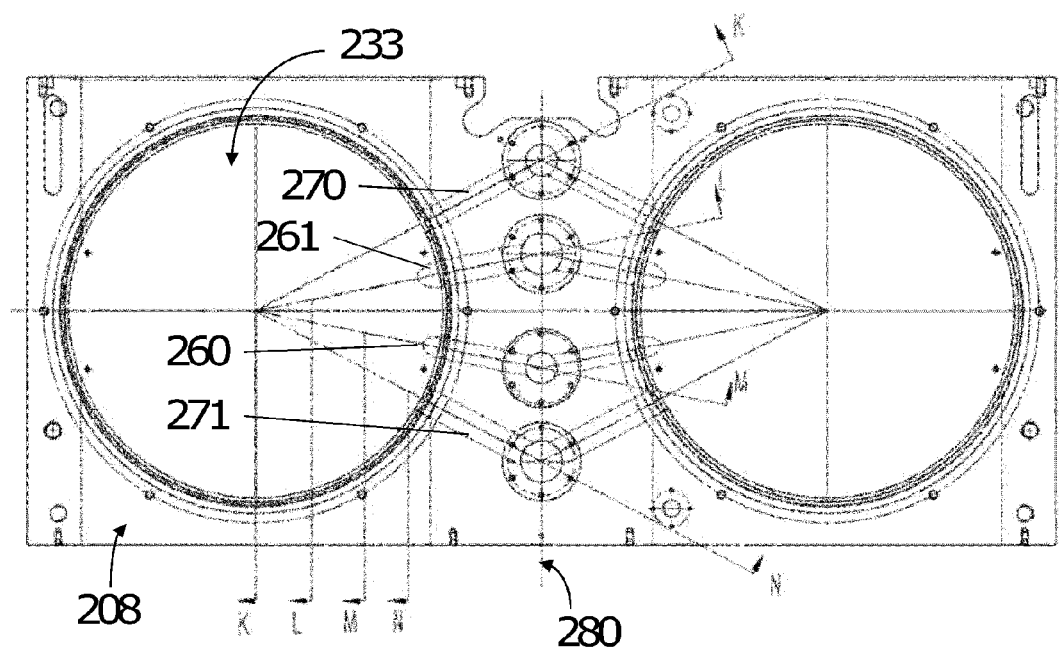
Fig. 5A
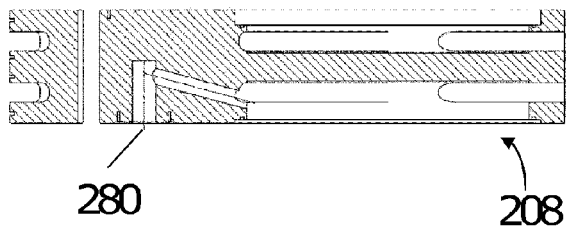
Fig. 5B (K-K)
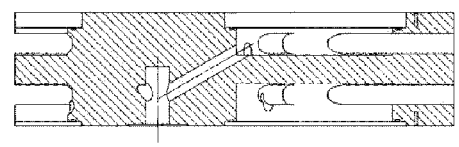
Fig. 5D (M-M)
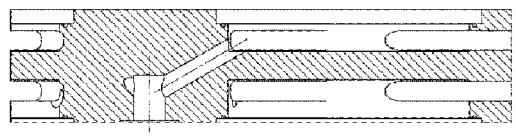
Fig. 5C (L-L)
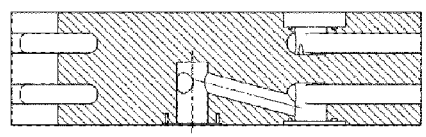
Fig. 5E (N-N)

LOAD LOCK CHAMBER AND THE CLUSTER TOOL SYSTEM USING THE SAME

CROSS-REFERENCE TO RELATED APPLICATION

This non-provisional application claims priority under 35 U.S.C. § 119(a) on Patent Application No. 201610153803.X filed in P.R. China on Mar. 16, 2016 the entire contents of which are hereby incorporated by reference.

BACKGROUND

Technical Field

This invention relates to load lock chamber, and more particularly to a symmetric load lock chamber with multiple layers for sealing up one or more wafers.

Description of Related Art In the process of manufacturing semiconductors, substrate throughput is always a challenge. With the advancement in the technology, the semiconductor substrates have to be processed in a continuous and efficient manner. To satisfy the foregoing demand, cluster tool apparatuses have been developed to process multiple substrates separately without altering the main vacuum environment of the entire process for the processing of certain substrate. Instead of merely processing a single substrate and then exposing the substrate to atmosphere during transfer to another chamber, the cluster tool apparatus whose multiple processing chambers are coupled to a common transfer chamber is capable of transferring a processed substrate to another processing chamber for further treatment under the same vacuum environment.

In addition, each of multiple transfer chambers coupled with multiple processing chambers can be connected to a load chamber (or a load lock chamber) to increase substrate throughput. Generally, a load lock chamber is utilized to transfer a wafer substrate from an environment at atmospheric pressure into a vacuum environment for processing semiconductors.

Since the load lock chamber can be served as an input terminal of the entire wafer process, the loading speed for the wafers becomes a factor affecting the semiconductor manufacturing process. Therefore, there is a need in the art to increase the performance and efficiency of the load lock chamber.

SUMMARY

Disclosed is a load lock chamber having more efficiency.

In one aspect of the invention, the load lock chamber has a chamber body which includes at least one pair of cavities, defined in a layer structure of the chamber body to carry one or more wafer substrates; at least one internal conduit, defined between and coupled with the paired cavities, such that the paired cavities are communicated with each other and capable of conducting gas refilling and exhaustion; and a plurality of wafer supports for carrying the wafer substrates, the plurality of wafer supports being securely received in the paired cavities and able to calibrate with a machine arm frontend finger, wherein the wafer support includes grooves defined thereon for calibrating the machine arm frontend finger.

Preferably, the chamber body includes multiple layer structures each of which includes the pair of the cavities.)

Preferably, the chamber body includes a rack provided with interior walls defining the pair of cavities.

Preferably, the chamber body includes lids detachably mounted on the rack; the pair of cavities is defined by the lids and the interior walls of the rack.

Preferably, the rack is provided with a middle portion defined by the at least one internal conduit between the paired cavities.

Preferably, each of the plurality of the wafer supports is provided with a plurality of positioning members, each of the plurality of positioning members has a top and a bottom, the wafer support is securely positioned in the pair of cavities with the top or bottom touching the interior walls defining the cavities.

Preferably, the wafer support is provided with limiting bumps configured for limiting displacement of the wafer substrate on the wafer support.

Preferably, the wafer support has a transfer region defined between the grooves for the machine arm frontend finger passing therethrough.

Preferably, the wafer support is provided with a side wall which is separated, with a distance, from an edge of the machine arm frontend finger, said distance is used to calibrate the machine arm frontend finger to align with the wafer support.

Another aspect of the invention provides a cluster tool which includes: a transfer chamber, provided with a machine arm having a frontend finger; and a load lock chamber, coupled to the transfer chamber and collaborative with the frontend finger. The load lock chamber has a chamber body which includes: at least one pair of cavities, defined in a layer structure of the chamber body for carrying one or more wafer substrates; at least one internal conduit, defined between and coupled with the paired cavities, such that the paired cavities are communicated with each other and capable of conducting gas refilling and exhaustion; and a plurality of wafer supports for carrying the wafer substrates, the plurality of wafer supports being securely received in the paired cavities and able to calibrate the frontend finger, wherein the wafer support includes grooves defined thereon for calibrating the frontend finger.

These and other aspects as well as embodiments will become clear, for the skilled persons in related arts, with reference to the following detailed description and drawings.

BRIEF DESCRIPTION OF THE DRAWINGS

The scale and ratio as illustrated in the drawings do not limit the actual embodiments of the invention.

FIG. 5A shows a bottom view of the chamber body.

FIGS. 5B to 5E show several cross-sectional views according to FIG. 5A.

DETAILED DESCRIPTION

Figure 1:
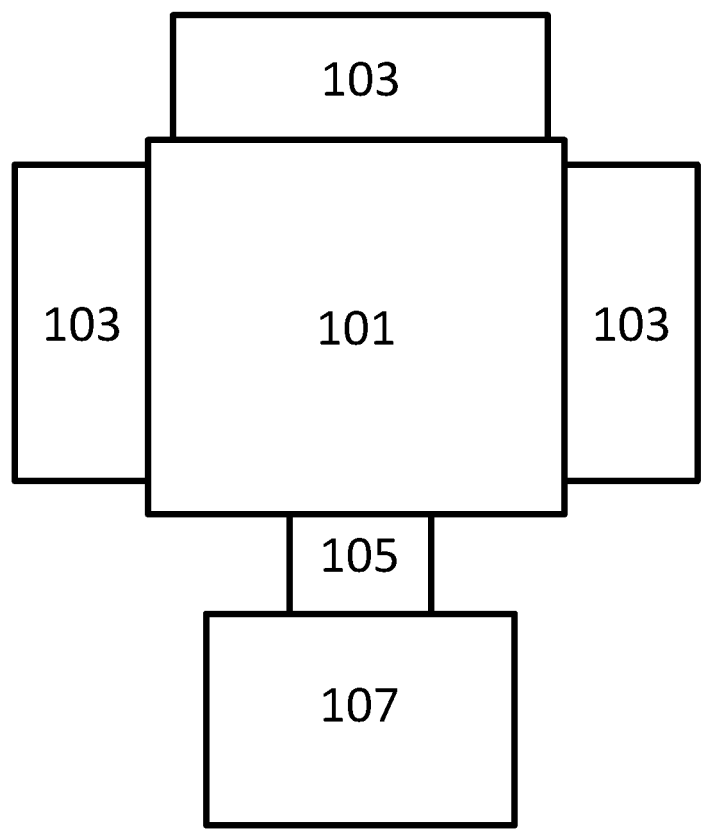
FIG. 1 is a schematic diagram showing a processing system provided with multiple chambers.

The invention provides a load lock chamber for loading and unloading wafer substrates. Said load lock chamber can be an integral part of a cluster tool system, such as means for coupling between two neighboring transfer chambers. Alternatively, said load lock chamber can be served as a gateway of the multi-chamber processing system, i.e. means for switching between an atmospheric pressure interface and a vacuum interface. The load lock chamber allows various processing operations of the cluster tool system to proceed without altering the vacuum, regardless of whether the wafer substrate is transferred from a chamber at atmosphere into a chamber under vacuum, or vise versa.

Now the embodiments according to the invention will be described in detail with the accompanying drawings. In the accompany drawings, identical and/or corresponding components are illustrated by identical reference symbol.

Various embodiments will be disclosed below; however, it must be understood that these embodiments are merely exemplary examples of the invention that may be embodied in various and alternative forms. Moreover, each of examples provided to interconnect various embodiments is intended to be illustrative rather than limiting. Furthermore, the drawings do not necessarily conform to actual scale, and certain features may have been enlarged to show the component in detail (any size, material and the like shown in the drawings are intended to be illustrative rather than limiting). Therefore, specific structural and functional details disclosed herein are not to be construed as limiting, but merely as a representative basis for teaching a person skilled in the related art to implement the disclosed embodiments.

FIG. 1 shows a schematic view of a cluster tool system 100 (or a cluster tool). Cluster tool may include one or more transfer chambers, a plurality of processing chambers coupled to the one or more transfer chambers, and one or more load lock chambers. For example, the cluster tool system 100 includes a first transfer chamber 101. The first transfer chamber 101 is coupled with a plurality of first processing chambers 103 at a periphery thereof. Each of the plurality of first processing chambers 103 can mechanically communicate with the first transfer chamber 101. Said first transfer chamber 101 includes at least one machine arm configured therein (not shown), which is drivable to carry and convey at least one wafer substrates, and thereby either the pending wafer substrates can be placed into the processing chambers or the processed wafer substrates can be removed from the processing chambers.

The first processing chambers 103, each chamber can provide a treatment different from that within another one, such as one or more pretreatments preprocessing operations including adjustment and cleaning of the wafer substrate as well as one or more post-processing operations including etching and deposition. In fact, there are numerous combinations for the cluster tool 100 which is not limited according to the disclosure.

The cluster tool system 100 further includes a first load lock chamber 105 having one side coupled to the first transfer chamber 101 while an opposite side coupled to an atmospheric interface 107.

The first load lock chamber 105 is configured to convey a wafer substrate (or a glass substrate) between the first transfer chamber 101 that is under vacuum and the atmospheric interface 107. The first load lock chamber 105 receives the machine arm driven from the first transfer chamber 101 in order to transfer the wafer substrate therein the first load lock chamber 105 to the respective first processing chambers 103 from the first load lock chamber 105.

Figure 2:
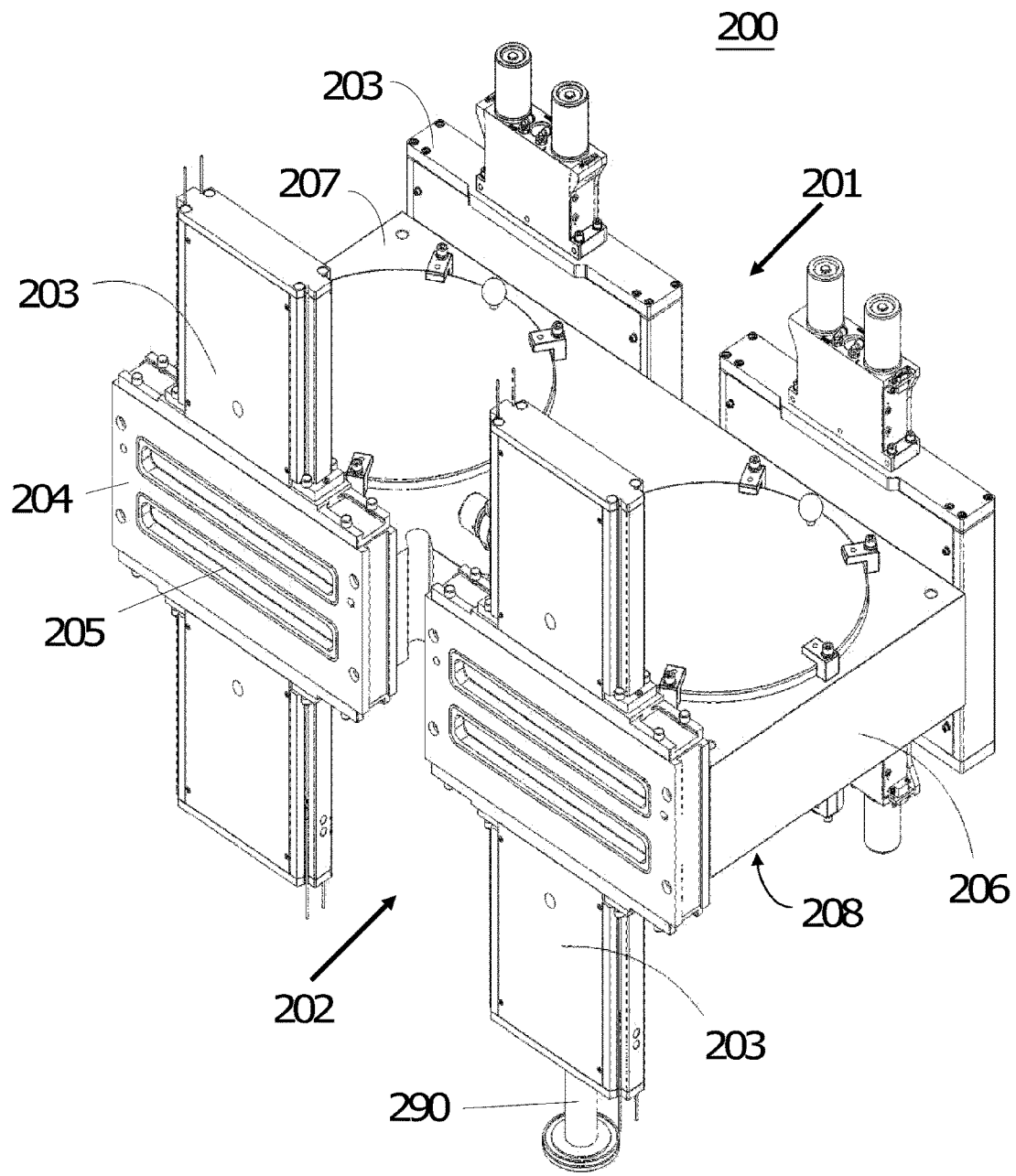
FIG. 2 shows an embodiment of the load lock chamber in accordance with the present invention.

FIG. 2 shows an embodiment 200 of a load lock chamber provided in accordance with the present invention. Particularly, the illustrated load lock chamber 200 is used with the first load lock chamber 105 shown in FIG. 1. FIG. 2 shows a perspective view of the load lock chamber 200. The load lock chamber 200 is provided with a loading and unloading side 201 and a coupling side 202. The coupling side 202 of the load lock chamber 200 is attached to a periphery of the first transfer chamber 101 shown in FIG. 1 while the loading and unloading side 201 of the load lock chamber 200 is coupled to the atmospheric interface 107 shown in FIG. 1. The loading side 201, in part, can be operated at atmospheric pressure.

The loading and unloading side 201 and coupling side 202 of the load lock chamber 200 are respectively provided with a plurality of valve doors. As can be seen in FIG. 2, the coupling side 202 of the load lock chamber 200 is provided with two valve door assemblies 203, and each of which has a doorframe 204 positioned at the coupling side 202 and holding a plurality of drivable valve doors. The doorframe 204 has two slits 205 (defined by the valve doors) separated apart with a vertical distance and corresponding to a plurality of cavities defined in the load lock chamber 200. Generally, the size of each slit 205 is larger than that of the wafer substrate such that the wafer substrate can smoothly pass through the slit 205. The communication between each slit 205 and the corresponding cavities is determined by the respective valve door. Generally, once the slit (valve door) 205 is closed, the cavity corresponding thereto cannot be communicated with the transfer chamber or other chamber at atmospheric pressure. The valve door assembly 203 at the loading and unloading side 201 may be of a configuration similar with that provided at coupling side 202. Particularly, the respective valve doors at the loading and unloading side 201 and the coupling side 202 can be separately driven, thereby flexibly scheduling the process. Various valve doors and driving mechanism therefor can be adaptively selected depending on different pressure interfaces, such as vacuum or atmosphere.

The load lock chamber 200 includes a chamber body 206 extending between the loading and unloading side 201 and coupling side 202, and the chamber body 206 has a thickness in the vertical direction that defines the chamber body 206 has a top 207 and a bottom 208. The chamber body 206 includes a plurality of cavities defined therein, wherein at least one cavity extends in a direction from the top 207 toward the bottom 208.

Figure 3:
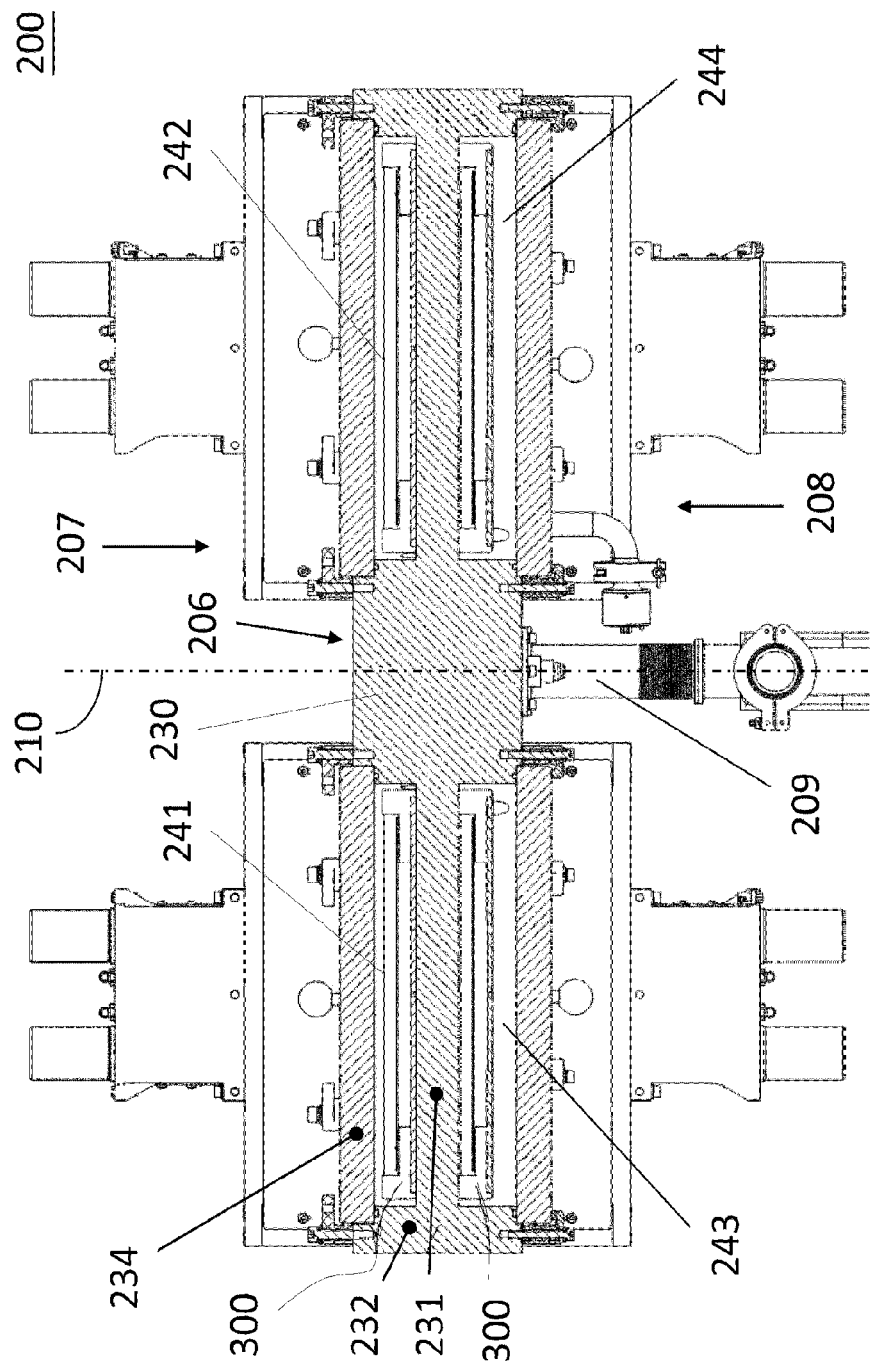
FIG. 3 shows a cross-sectional view according to the load lock chamber in FIG. 2.

As can be seen in FIG. 3, a cross-sectional view of the load lock chamber 200 illustrates the interior structure of the chamber body 206 and the valve door assemblies 203 at the loading and unloading side 201. The interior structure of the load lock chamber 200 is symmetric. More specifically, the load lock chamber 200 can be divided into a left half portion and a right half portion along an extending axis 210 which generally extends along a conduit 209 and serves as a symmetry axis. The conduit 209 is coupled to the bottom 208 of the load lock chamber 200. The left and right half portions respectively correspond to the valve door assemblies 203 at the loading and unloading side 201 and coupling side 202. The left and right half portions respectively include a plurality of vertically arranged cavities superimposed vertically without communicating with each other. As shown in FIG. 3, each half portion of the chamber body 206 includes an upper cavity and a lower cavity that do not communicate with each other; however, the upper cavities (and the lower cavities) of the left and right half portions mutually communicate with each other.

Figure 4A:
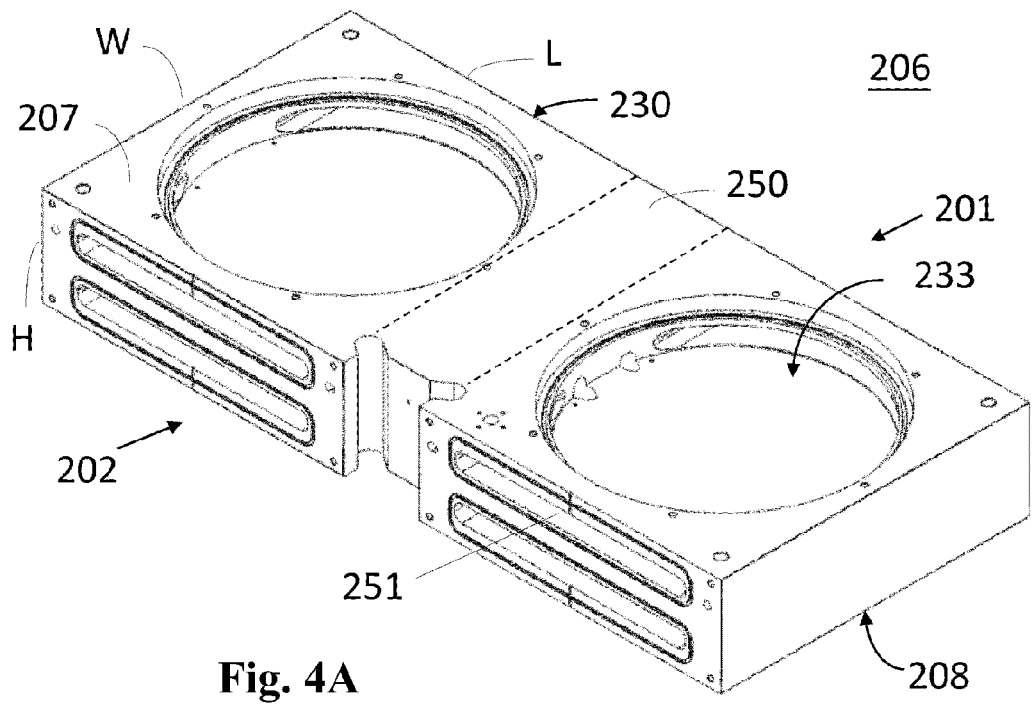
FIG. 4A shows a perspective view of a chamber body included in the load lock chamber in accordance with the present invention.

The chamber body 206 includes a rack 230 with a symmetric configuration along the vertical direction, which is also the main structure of the chamber body 206. The rack 230 extends between the top 207 and the bottom 208, and the rack 230 has a horizontal interior wall 231 extending from each of two sides of the symmetry axis 210 in the horizontal direction and is terminated by a vertical wall 232. The interior wall 231 has a vertical thickness less than the thicknesses of the middle portion (in the proximity of the symmetry axis 210) and the vertical wall 232 of the rack 230, thereby defining recesses extending along the horizontal direction. As illustrated in FIG. 4A, a perspective view of the rack 230 of the chamber body 206 shows recesses 233 defined by the rack 230 according to FIG. 2.

Referring back to FIG. 3, the chamber body 206 further includes a plurality of lids 234 configured to correspond to the recesses 233. The lid 234 may be sized slightly larger than the recess 233 so as to cover the recess 233. The lid 234 is mounted onto the rack 230 such that the rack 230 and the lids 234 define the plurality of cavities, e.g. a first cavity 241, a second cavity 242, a third cavity 243 and a forth cavity 244, wherein the first and third cavities 241, 243 are respectively arranged at the upper and lower sides of the left half portion, and the second and fourth cavities 242, 244 are respectively arranged at the upper and lower sides of the right half portion. The first and second cavities 241, 242 are substantially at the same height in the chamber body 206 and communicate with each other, and the third and fourth cavities 243, 244 are substantially at the same height in the chamber body 206 and communicate with each other. In other embodiments of the present invention, the lids 234 can be detachably mounted on the rack 230 through a specific engaging mechanism. More particularly, the lid 234 can be made of transparent materials such that the interior of the chamber is visible to the outside.

In other embodiments of the present invention, although not shown in the drawings, the chamber body 206 may includes more than one racks 230 that are vertically superimposed to fulfill a load lock chamber having more layers of cavities defined therein. Although not shown in the drawings, the chamber body may be reduced to include a least unit of layer structure. That is, defining a left cavity and a right cavity by only a single rack 230 and two lids 234. In some embodiments of the present invention, more than one recesses 233 can be formed at each of two sides of the chamber body 206 along the symmetry axis 210 such that a single layer in the load lock chamber can be loaded with more wafer substrates.

Figure 4B:
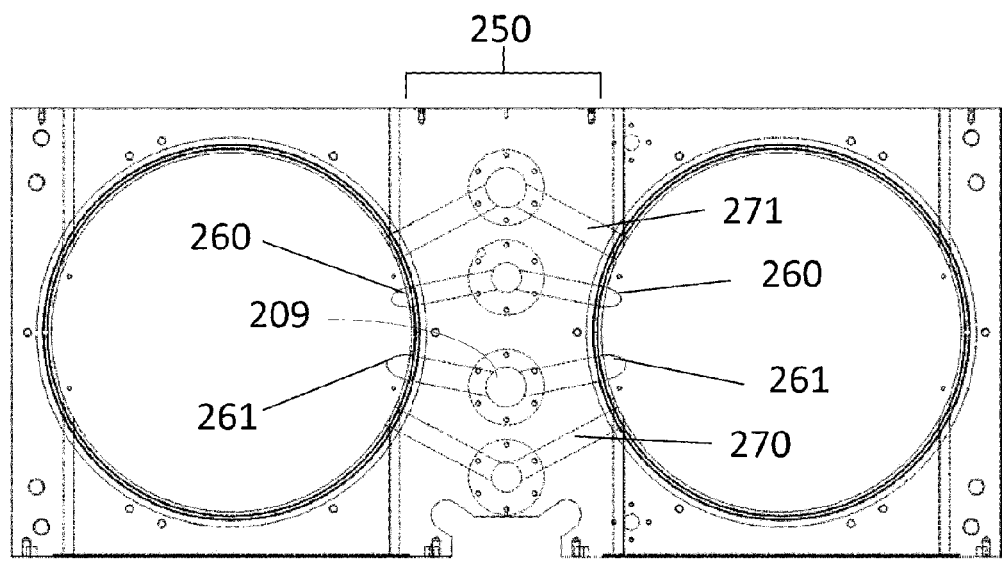
FIG. 4B shows a top view of the chamber body.

Referring to FIGS. 4A and 4B, among which FIG. 4A shows a perspective view of the chamber body 206 while FIG. 4B shows a top view of the chamber body 206. The chamber body 206 has a thickness H extending along the vertical direction, a length L and width W extending along a horizontal plane. The chamber body 206 defines a plurality of recesses 233, each of which has a substantially flat cylindrical shape and a radius in the horizontal direction. As shown in FIG. 4B, the cross section of the recess 233 has a substantially circular shape with a diameter less than the width W of the chamber body. The chamber body 206 has at least one pair of recesses 233 arranged along the length L direction, and the sum of the diameters of the pair of recesses 233 is less than the length L of the chamber body.

The chamber body 206 is provided with a middle portion 250 which is a part of the rack 230. For example, the middle portion 250 can be the area where the rack 230 is coupled with the external conduit 209. As shown in FIG. 4B, the top view of the rack 230 shows the coupling of four internal conduits 260, 261, 270 and 271 (shown by dotted lines) defined therein. These internal conduits have respective symmetric positions aligned in the width W direction. Such alignment defines the middle portion 250 of the rack 230. The middle portion 250 can be considered as a center of the symmetric structure in the chamber body 206. Referring to the rack 230 shown in FIG. 3, a structure having a thickness greater than the thickness of the interior wall 231 and in the proximity of the symmetry axis 210 is the middle portion thereof. The middle portion 250 can divide the chamber body 206 into left half and right half portions. The pair of recesses 233 are symmetrically disposed with respect to the middle portion 250 serving as a symmetric center in the rack 230, and consequently, the rack 230 is also a symmetric structure.

The rack 230 defines a plurality of openings 251 respectively at the loading and unloading side 201 and the coupling side 202, and each opening 251 extends inwardly along the width W direction and communicates with the recess 233 corresponding thereto. The opening 251 has a size smaller than the recess 233 diameter. The openings 251 are arranged to correspond to the slits 205 defined on the valve door assemblies 203 shown in FIG. 2, such that the wafer substrate can be placed into or removed from the recess 233 through the valve doors.

The rack 230 includes several pairs of recesses 233. Each pair of recesses 233 are generally defined at the same level height and distributed symmetrically with respect to the middle portion 250. The plurality of pairs of recesses 233 can be superimposed along the height H direction. As shown in FIG. 4A, a pair of recesses is defined at a low level height while another pair of recesses is defined at a relatively high level height. These pairs of recesses can be symmetrically distributed with respect to the middle portion 250. As shown in FIG. 3, the lids 234 are mounted to the rack 230 to cover these recesses 233 to form cavities, such as cavities 241 through 244.

The chamber body 206 includes several pairs of cavities Each pair of cavities is symmetrically distributed with respect to the middle portion 250, and cavities of each pair communicate with each other via at least one internal conduit. As shown in FIG. 4B, the rack 230 includes a plurality of internal conduits communicatively coupling to external conduits, such as the conduits 209 shown in FIG. 2 and FIG. 3. The internal conduits include conduits for the upper layer and lower layer. The conduits for the upper layer may include a refill conduit 260 and an exhaust conduit 261. The conduits for the lower layer may include another refill conduit 270 and another exhaust conduit 271. These conduits 260, 261, 270 and 271 are independent from one another and each of them extends to the cavities in respective layer which share the same conduits. For example, the refill conduit 260 for the upper layer is configured to supply reaction gas into the upper cavities, such as the first and second cavities 241, 242 shown in FIG. 3; the exhaust conduit 261 for the upper layer is configured to exhaust gases from the upper cavities in order to alter the work environment therein, i.e. to switch between atmosphere and vacuum. Thus, the pressures in the cavities at the upper layer can be simultaneously controlled. Moreover, the respective cavities at the upper and lower layers can be controlled independently.

Referring to FIG. 5A, the bottom view shows the bottom 208 of the rack 230 with section lines extending along the internal conduits 260, 261, 270 and 271 to the recesses 233 of the left half portion. Referring FIGS. 5B to 5E, the cross-sectional views according to FIG. 5A show the paths of the internal conduits 260, 261, 270 and 271 respectively. These internal conduits 260, 261, 270 and 271 extend inwardly for a distance from the bottom 208 of the rack 203, and then extend obliquely toward the recesses (or cavities) at the upper and lower layers, respectively. Preferably, these internal conduits extend obliquely in a horizontal direction toward a center of the recess 233. FIG. 5A further shows start positions 280 of these internal conduits at the bottom 208 (which can be referred to as the terminal points of these internal conduits at the bottom of the rack 230), which are linearly aligned and serve as a symmetry axis for the symmetrical configurations of the rack 230, the chamber body 206 or the load lock chamber 200. Thus, the cavities, the internal conduits or other paths may be configured in a symmetrical manner with respect to this symmetry axis.

The start positions 280 of these internal conduits 260, 261, 270 and 271 may not necessarily be aligned linearly. More or less internal conduits can be disposed in between the paired cavities of the upper layer and/or the lower layer, such that two of the paired cavities may share the internal conduits. This approach may simplify the layout of conduits in the load lock chamber. The conduits of the load lock chamber, such as the internal conduits 261 and 271, may be coupled to a pump apparatus via respective external conduits 209 and other valves while other internal conduits, such as conduits 260 and 270, may be coupled to a gas refilling apparatus to control the work environment in the load lock chamber.

Referring back to FIG. 3, the load lock chamber 200 in accordance with the present invention further includes a plurality of wafer supports 300 respectively securely accommodated in the cavities of the chamber body 206 for supporting the wafer substrate. The wafer support 300 is securely positioned in the cavity. For example, the wafer support 300 is able to mount on the interior wall 231 of the rack 230. The wafer support 300 includes a calibration mechanism for calibrating the position at which the machine arm, especially its finger (such as machine arm operated by the transfer chamber 101 illustrated in FIG. 1) being received.

Figure 6:
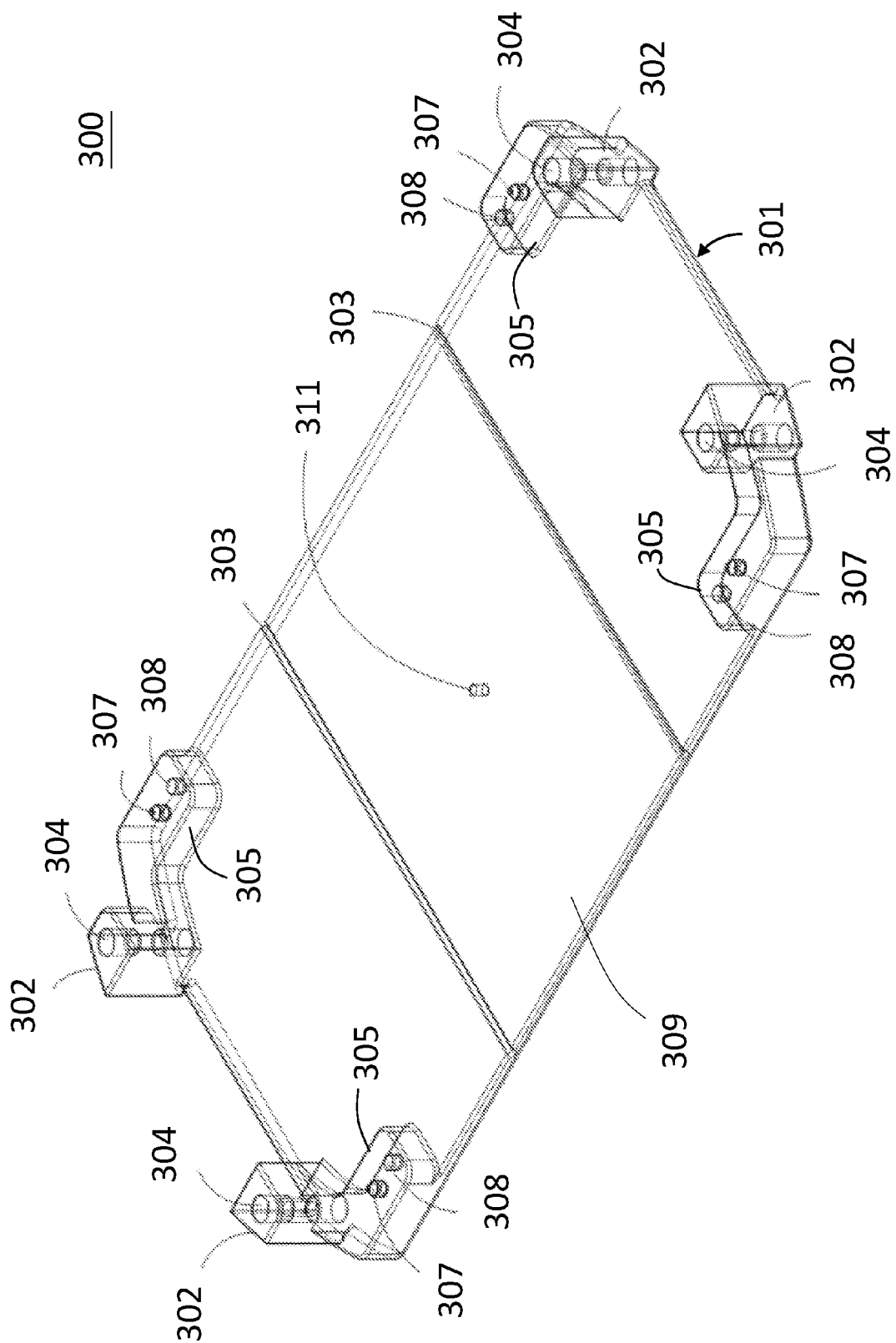
FIG. 6 shows a wafer (substrate) support included in the load lock chamber in accordance with the present invention.
Figure 7A:
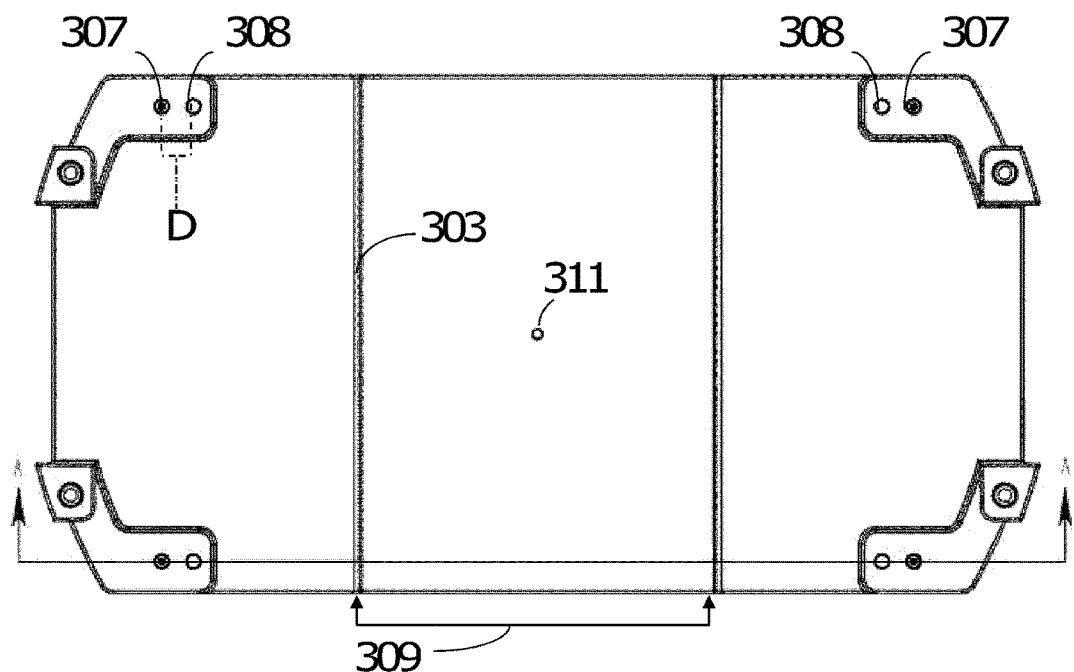
FIG. 7A shows a top view of the wafer support.
Figure 7B:
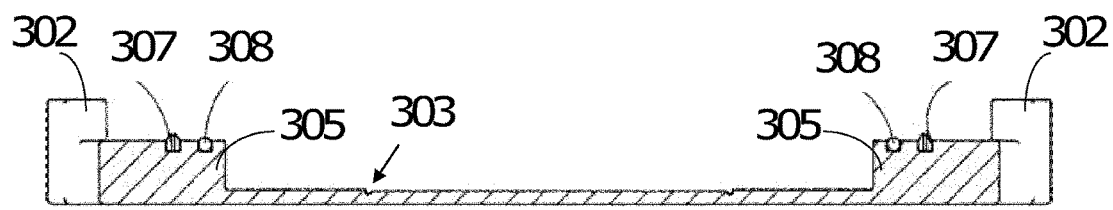
FIG. 7B shows a cross-sectional view according to FIG. 7A.

Referring to FIG. 6, the perspective view shows the wafer support 300. FIGS. 7A and 7B shows the top view of the wafer support and the cross-sectional view thereof, respectively. The wafer support 300 includes a panel 301, a plurality of positioning members 302 for positioning the wafer support 300 and grooves 303 defined on the panel 301 for calibrating the machine arm. The panel 301 is provided with a long side and a short side. The panel 301 is configured to extend and securely positioned in the cavity. The wafer support 300 is securely positioned in the cavity with the long side of the panel 301 corresponding to the openings 251 defined on both sides of the chamber body 206.

The panel 301 is provided with the positioning members 302 formed on one side thereof. The positioning member 302 is a structure extending from the panel 301. As shown in FIG. 6, the positioning members 302 can be formed on the corners of the panel 301 and extend in the vertical direction. As shown in FIG. 7B, the positioning members 302 have substantially the same height. The top of the positioning members 302 may be in contact with the interior wall defining the cavity. The positioning member 302 may have a planar surface defined on its top. Also, the bottom of the positioning members 302 may be in contact with the interior wall defining the cavity, wherein the positioning member 302 may have a planar surface defined on its bottom or coplanar with the panel 301. The wafer support 300 is able to be mounted on the interior wall defining the cavity via the positioning members 302. For example, the positioning members 302 can define one or more threaded holes 304 penetrating through the top and/or bottom thereof. Any threading means can be applied to the top or bottom of the positioning members 302. Accordingly, at least two approaches may be provided to install the wafer support 300. For example, as shown in FIG. 3, the wafer support 300 may be secured with its bottom of the positioning members 302 mounted to the interior wall 231 defining the upper cavities or with its top of the positioning members 302 mounted to the interior wall 231 defining the lower cavities. Preferably, the positioning members 302 may be configured to abut against the wall defining the cavity with its side wall such that the wafer support 300 can be secured laterally in the cavity.

The panel 310 is provided with a plurality of support platforms 305 formed at one side thereof. The support platforms 305 may be formed at the same side with the positioning members 302. The support platforms 305 may be integrally formed with the positioning members 302, and the support platforms 305 are located between the panel 301 and positioning members 302. As shown in FIG. 7B, the support platform 305 has a height less than that of the positioning members 302. The support platforms 305 are configured to support the wafer substrate. For example, each support platform 305 further has a position-limiting bump 307 and a support bump 308 formed on the top thereof. As shown in FIG. 7B, the position-limiting bump has a height slight greater than the height of the support bump. Generally, the position-limiting bumps 307 surround the support bumps 308. As shown in FIG. 7A, a horizontal area defined by the four position-limiting bumps 307 is larger than a horizontal area defined by the four support bumps 308, wherein the area defined by the support bumps 308 is less than that of the wafer substrate such that the wafer substrate is able to sit on the support bumps 308. The support bump 308 may be in the form of a ball or a spherical cylindrical body which may be a monocrystalline solid state material, such as sapphire. The position-limiting bumps 307 are configured to limit the lateral offset of the wafer substrate sit on the support bumps 308. As shown in FIG. 7A, each position-limiting bump 307 is spaced from the adjacent support bump 308 with a horizontal distance D which permit the wafer substrate on the support bumps 308 has a tolerance of the displacement D. Therefore, the wafer substrate is able to locate at a suitable place on the wafer support 300.

Figure 8A:
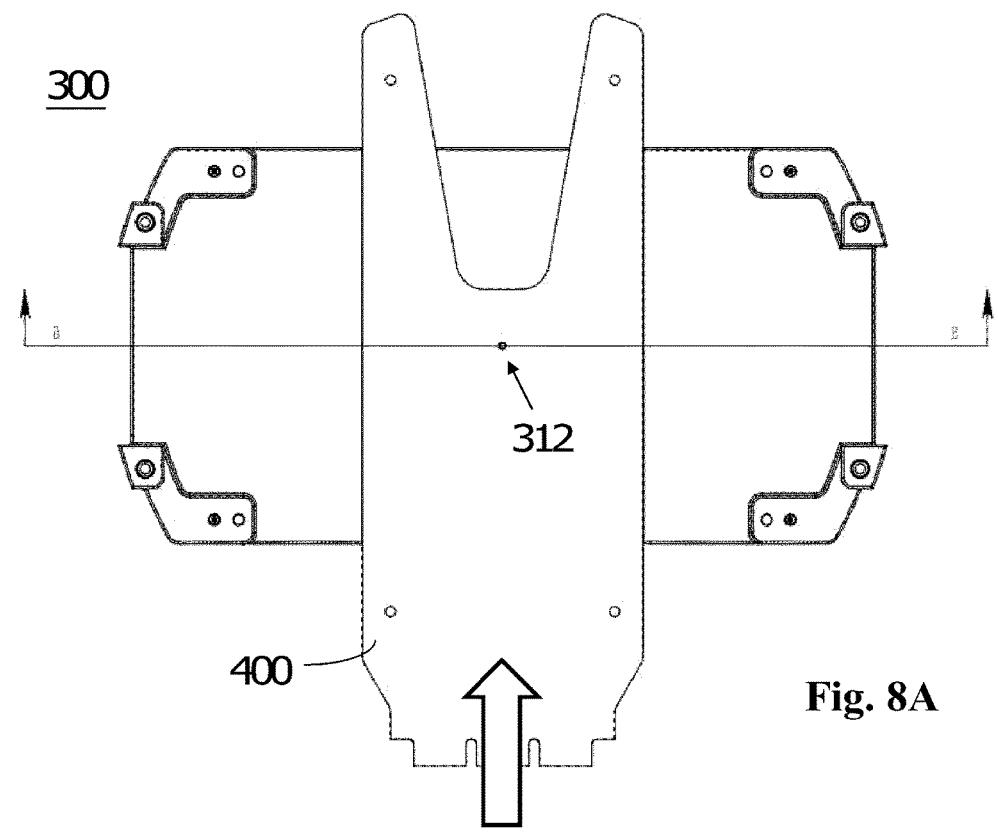
FIG. 8A shows the wafer support collaborated with the frontend of a machine arm.

The panel 301 is provided with grooves 303 defined thereon. As shown in FIGS. 6A and 7A, there are two parallel grooves 303 defined on one side thereof, and the grooves 303 extend in a direction substantially parallel to the width direction and between the opposing long sides of the panel 301. The grooves 303 are spaced apart at a distance, and a transfer region 309 is defined on the panel 301 between the grooves 303. The transfer region 309 provides a throughway for the machine arm finger passing therethrough in order to transfer and place the wafer substrate. As shown in FIG. 8A, the top view according to FIG. 7A with a machine arm whose frontend finger 400 (such as operated by the transfer chamber 101 in FIG. 1) passing through the wafer support 300.

Figure 8B:
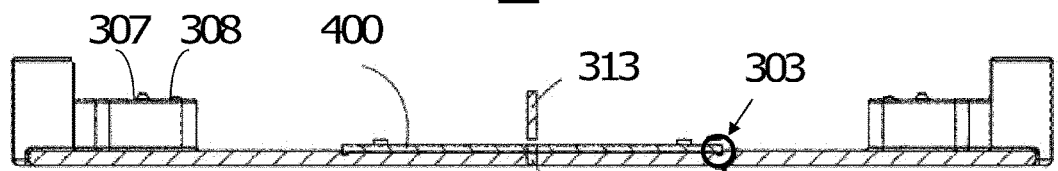
FIG. 8B shows a cross-sectional view according to FIG. 8A.

Generally, the finger 400 of the machine arm is flat so as to carry the wafer substrate. The grooves 303 can be served as baselines for calibrating the finger 400 of the machine arm, or can be served as guidelines for guiding the finger 400 of the machine arm. FIG. 8B, the cross-sectional view according to FIG. 8A. The frontend finger 400 is capable of carrying the wafer substrate (not shown) and can be driven to suspense and pass through the transfer region 309. The finger 400 of the machine arm is then driven to descend vertically until the carried wafer substrate rests on the support bumps 308. The finger 400 of the machine arm may be driven to descend until it contacts the panel 301. The calibration for the machine arm frontend finger 400 of the machine arm can be achieved based on the relative positions of the finger 400 of the machine arm with respect to the grooves 300.

The finger 400 of the machine arm may have a width generally equal or slightly less than the distance between the grooves 303. If it can be seen that one side of the finger 400 of the machine arm lies on the groove 303, it means the finger 400 of the machine arm might move in the correct path. If one side of the finger 400 of the machine arm falls outside of the groove 303 visibly, it means the finger 400 might deviate from the correct path and therefore required to be calibrated. The process of calibration can be observed through the transparent lids 234 as shown in FIG. 3.

Figure 8C:
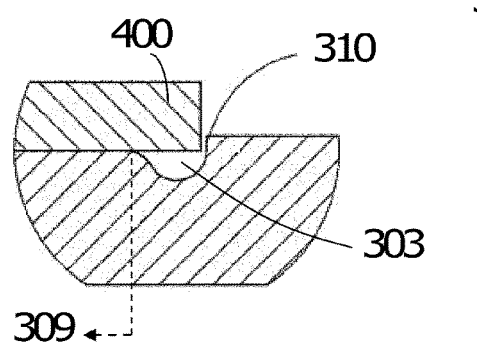
FIG. 8C shows an enlarged portion according to FIG. 8B.

Referring to FIG. 8C, the enlarged view according to FIG. 8B clearly shows a relation between an edge of the frontend finger 400 and the groove 303. In other embodiments of the present invention, the transfer region 309 of the panel 301 may be slightly lower than other parts of the panel 301. As shown in FIG. 8C, the transfer region 309 at one side of the groove 303 is formed with an altitude difference compared to another side of the panel 301 so that the finger 400 of the machine arm is partially received in the panel 301. A side wall 310 may be provided on the panel 301 adjacent to the groove 303 as shown in FIG. 8C, and thereby existing a gap between the frontend finger 400 of the machine arm and the side wall 310. Such a calibration gap can be used to determine whether the finger 400 of the machine arm moves in the correct path.

The panel 301 may further have a hole defined thereon for the calibration. As shown in FIGS. 6, 7A and 8B, the panel 301 has a hole 311 defined on the transfer region 309. The calibration hole 311 is generally located at a center of the support panel 301 relative to the four position-limiting bumps 307. The finger 400 of the machine arm has another corresponding calibration hole 312 defined thereon for the calibration as shown in FIG. 8A. Preferably, the two holes 311 and 312 should be aligned together after the frontend finger 400 of the machine arm passes and stops at the predetermined position above the panel 301. The present invention may be further provided with a pin 313, which can penetrate through the calibration holes 311 and 312 to inspect whether the finger 400 of the machine arm moves in the correct path. In other embodiments of the present invention, more calibration holes may be provided, or other mechanisms, such as engaging members, may be substituted therefor.

Although one or more embodiments have been described for the load lock chamber in accordance with the present invention, it should be realized that the disclosed invention is not limited to the embodiments disclosed herein. Various modifications and similar configurations included in the aspects and essence of the claims covering the invention should be given with the broadest interpretation so as to include all of the modification and similar configuration therein. The disclosed invention also includes any of the embodiments recited in the following claims.

What is claimed is:

1. A load lock chamber, having a chamber body, the chamber body comprising:
   at least one pair of cavities, defined in the chamber body to carry one or more wafer substrates;
   at least one internal conduit, defined between and coupled with the paired cavities, such that the paired cavities are communicated with each other and capable of conducting gas refilling and exhaustion; and
   a plurality of wafer supports for carrying the wafer substrates, the plurality of wafer supports being securely received in the paired cavities and able to calibrate with a machine arm frontend finger, wherein the wafer support includes a panel, at least three support platforms provided on one side of the panel and plural positioning members next to the support platforms for positioning the wafer support in the corresponding cavity, each of the support platforms is provided with a position-limiting bump and a support bump for holding a wafer substrate in each of the at least one pair of cavities, the position-limiting bump has a height greater than that of the support bump of each of the support platform, and the position-limiting bumps of the support platforms surround the support bumps of the support platforms, and each of the support platforms has a height less than that of each of the positioning members.

2. The load lock chamber as claimed in claim 1, wherein each of the plurality of wafer supports has grooves formed on the one side of the panel to guide the machine arm frontend finger.

3. The load lock chamber as claimed in claim 2, wherein the wafer support has a transfer region defined between the grooves for the machine arm frontend finger passing therethrough.

4. The load lock chamber as claimed in claim 1, wherein the chamber body includes a rack provided with interior walls defining the pair of cavities.

5. The load lock chamber as claimed in claim 4, wherein the chamber body includes lids detachably mounted on the rack, the pair of cavities is defined by the lids and the interior walls of the rack.

6. The load lock chamber as claimed in claim 4, wherein the rack is provided with a middle portion defined by the at least one internal conduit between the paired cavities.

7. The load lock chamber as claimed in claim 1, wherein each of the positioning members has a top and a bottom, the wafer support is securely positioned in the pair of cavities with the top or bottom touching the interior wall defining the cavities.

8. The load lock chamber as claimed in claim 7, wherein the wafer support is provided with a side wall which is separated, with a distance, from an edge of the machine arm frontend finger calibrating with the wafer support, said distance is used to calibrate the machine arm frontend finger to align with the wafer support.

9. A cluster tool, comprising:
   a transfer chamber, provided with a machine arm having a frontend finger; and the load lock chamber as claimed in claim 1 coupled to the transfer chamber.

* * * * *